United States Patent
Smith et al.

(10) Patent No.: US 6,987,692 B2
(45) Date of Patent: Jan. 17, 2006

(54) MAGNETIC MEMORY HAVING ANGLED THIRD CONDUCTOR

(75) Inventors: Kenneth K. Smith, Bois, ID (US); Frederick Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 207 days.

(21) Appl. No.: 10/678,555

(22) Filed: Oct. 3, 2003

(65) Prior Publication Data
US 2005/0073882 A1    Apr. 7, 2005

(51) Int. Cl.
*G11C 11/15*    (2006.01)
(52) U.S. Cl. .................................. 365/173; 365/158
(58) Field of Classification Search ............... 365/173, 365/158
See application file for complete search history.

(56) References Cited

U.S. PATENT DOCUMENTS

| | | |
|---|---|---|
| 5,307,226 A | 4/1994 | Brug et al. |
| 5,477,482 A | 12/1995 | Prinz |
| 5,982,660 A | 11/1999 | Bhattacharyya et al. |
| 6,081,446 A | 6/2000 | Brug et al. |
| 6,134,139 A | 10/2000 | Bhattacharyya et al. |
| 6,163,477 A | 12/2000 | Tran |
| 6,259,644 B1 | 7/2001 | Tran et al. |
| 6,385,083 B1 | 5/2002 | Sharma et al. |
| 6,510,080 B1 * | 1/2003 | Farrar ........................ 365/171 |
| 6,654,278 B1 * | 11/2003 | Engel et al. ................. 365/158 |
| 6,836,429 B2 * | 12/2004 | Smith et al. ................. 365/158 |
| 2002/0089874 A1 | 7/2002 | Nickel et al. |

* cited by examiner

*Primary Examiner*—Anh Phung
*Assistant Examiner*—Hien Nguyen (57) ABSTRACT

One embodiment of a magnetic memory includes a magnetic memory stack and a first line adjacent the magnetic memory stack. A second line crosses the first line, and a third line crosses the first line and the second line. The third line is angled relative to the first line and the second line, where the first line, the second line and the third line are configured to produce magnetic fields that set states of the magnetic memory stack.

24 Claims, 4 Drawing Sheets

MAGNETIC MEMORY HAVING ANGLED THIRD CONDUCTOR

BACKGROUND OF THE INVENTION

One type of non-volatile memory, known as magnetic random access memory (MRAM), includes an array of magnetic memory cells. The magnetic memory cells may be of different types, such as magnetic tunnel junction (MTJ) memory cells or giant magnetoresistive (GMR) memory cells. Typically, a magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer.

Conductive traces referred to as word lines and bit lines are routed across the array of memory cells. The word lines extend along rows of the memory cells and the bit lines extend along columns of the memory cells. A memory cell stores a bit of information as an orientation of magnetization in the sense layer at each intersection of a word line and a bit line. The orientation of magnetization in the sense layer aligns along an axis of the sense layer referred to as its "easy axis". The orientation of magnetization does not easily align along an axis orthogonal to the easy axis, referred to as the "hard axis". Magnetic fields are applied to flip the orientation of magnetization in the sense layer along its easy axis to either a parallel or anti-parallel orientation with respect to the orientation of magnetization in the reference layer. The resistance through the memory cell differs according to the parallel or anti-parallel orientation of magnetization and is highest when the orientation is anti-parallel, i.e. one logic state, and lowest when the orientation is parallel, i.e. the other logic state.

In one configuration, a write circuit is electrically coupled to the word lines and the bit lines to write the state of a memory cell. The write circuit selects one word line and one bit line to change the orientation of magnetization in the sense layer of the memory cell situated at the conductors crossing point. A write current is passed through a word line to create a magnetic field along the hard axis and another write current is passed through a bit line to create a magnetic field along the easy axis. The hard axis magnetic field loosens the sense layer orientation of magnetization and the easy axis magnetic field flips the sense layer orientation of magnetization along the easy axis to switch the state of the memory cell. The magnitudes of the magnetic fields in the selected memory cell surpass levels needed to set or switch the state of the memory cell. The margin by which the magnitudes surpass the levels needed is referred to as a write margin. A large write margin ensures that the selected memory cell is written. However, an easy axis magnetic field alone can change the state of a memory cell.

The non-selected memory cells along the selected word line and bit line are presented with only one magnetic field. These memory cells are referred to as half-selected memory cells. The margin between the magnitude of the magnetic field in the half-selected memory cell and the level needed to switch the half-selected memory cell is referred to as the half-select margin. A large half-select margin ensures that half-selected memory cells will not be inadvertently switched.

The magnitudes of the magnetic fields needed to switch the state of a memory cell vary from cell to cell across the array. Some selected memory cells will not switch if the write currents and subsequent magnetic fields are too small. Alternatively, some half-selected memory cells will switch if the easy axis magnetic field surpasses a certain magnitude. Intermittent and inadvertent switching problems call for extra error correction mechanisms or the array is gradually rendered unreadable. Increasing the write margin and half-select margin reduces these problems and makes for a more reliable magnetic memory.

SUMMARY OF THE INVENTION

One embodiment of a magnetic memory includes a magnetic memory stack and a first line adjacent the magnetic memory stack. A second line crosses the first line, and a third line crosses the first line and the second line. The third line is angled relative to the first line and the second line, where the first line, the second line and the third line are configured to produce magnetic fields that set states of the magnetic memory stack.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
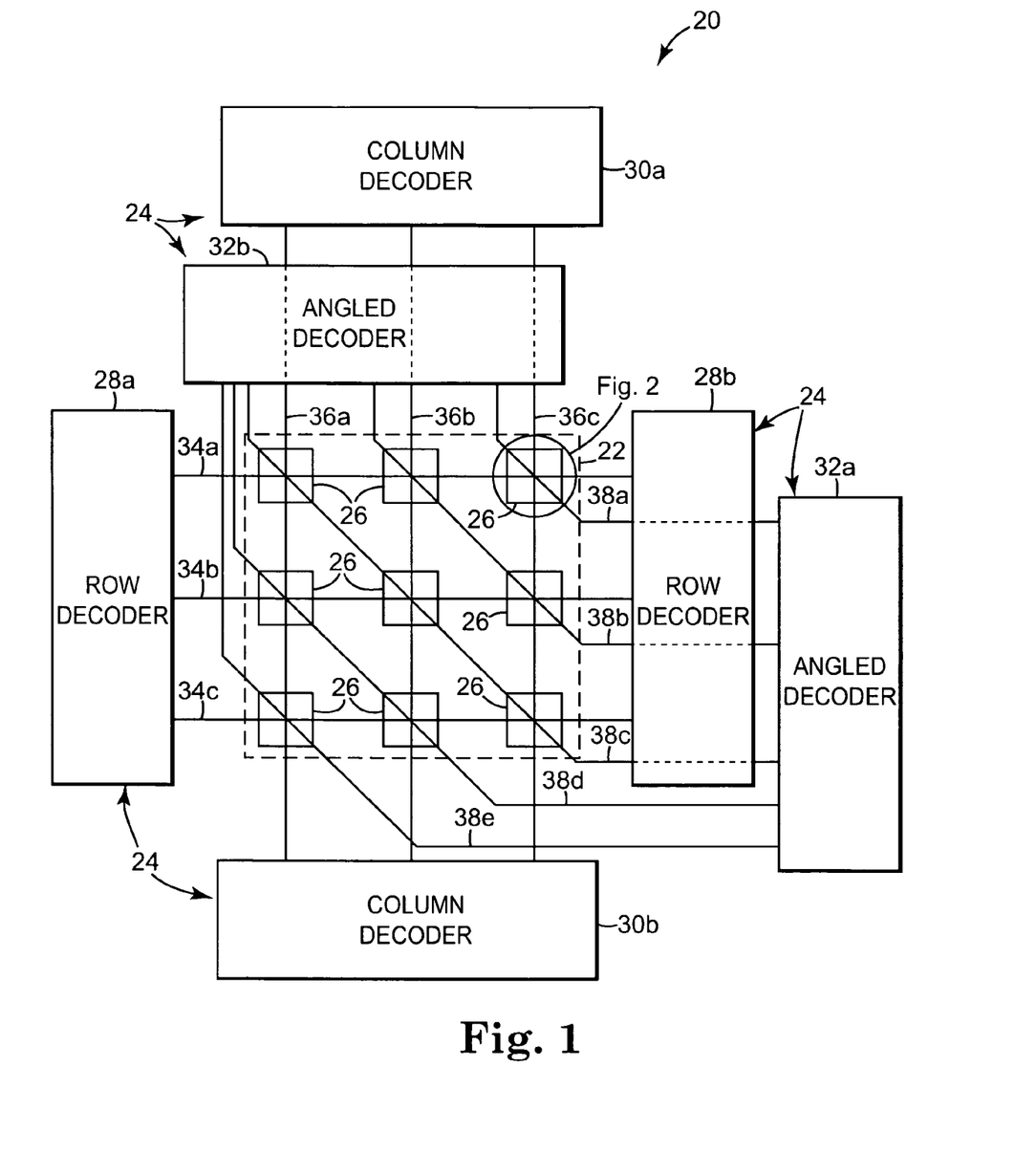
FIG. 1 is a block diagram illustrating one exemplary embodiment of a magnetic memory, according to the present invention.

FIG. 1 is a block diagram illustrating one exemplary embodiment of a magnetic memory 20, according to the present invention. The magnetic memory 20 includes one or more angled conductors crossing magnetic memory cells to aid in switching the state of the magnetic memory cells.

The magnetic memory 20 includes a magnetic memory cell array 22 electrically coupled to a write circuit 24 and a read circuit (not shown for clarity). The array 22 includes magnetic memory cells 26 arranged in rows and columns. The write circuit 24 includes a row decoder, indicated at 28a and 28b, a column decoder, indicated at 30a and 30b, and an angled decoder, indicated at 32a and 32b, electrically coupled to row, column and angled write conductors, specified herein as word lines 34a–c, bit lines 36a–c and angled lines 38a–e, respectively. The write conductors intersect at the memory cells 26. During a write operation, the write circuit 24 selects one row conductor, one column conductor and one angled conductor to write the intersected memory cell 26. The write circuit 24 supplies currents to the selected conductors to create magnetic fields around the conductors according to the right hand rule. The magnetic field around the angled conductor combines with the magnetic fields around the row and column conductors to switch the state of the selected memory cell 26. The combined magnetic field in the selected memory cell 26 is stronger with the additional angled magnetic field. Non-selected memory cells 26 situated along selected conductors, referred to as half-selected memory cells 26, are presented with only one magnetic field. Write currents can be chosen to increase the write margin for a selected memory cell 26 and increase the half-select margin for the half-selected memory cells 26. The third angled conductor is used to increase write margins and half-select margins as described in more detail later in this application.

The magnetic memory 20 includes the magnetic memory cell array 22 having a plurality of the magnetic memory cells 26. The memory cells 26 are arranged in rows and columns, with rows extending along an x-direction and columns extending along a y-direction. In the present embodiment, the easy axes of the memory cells 26 are along the x-direction, and the hard axes are along the y-direction. In another embodiment, the easy axis and hard axis directions are switched, with the easy axis along the y-direction and the hard axis along the x-direction. In other embodiments the easy axis and hard axis can be angled in relation to the x-direction and y-direction. Also, only a relatively small number of the memory cells 26 are shown to simplify the illustration of the magnetic memory 20. In practice, arrays of any size may be used.

Conductive traces functioning as word lines 34a–c and bit lines 36a–c extend across the array 22. The word lines 34a–c, which are row conductors, extend along the x-direction in a plane on one side of the array 22. The bit lines 36a–c, which are column conductors, extend along the y-direction in a plane on an adjacent side of the array 22. There is one word line 34a–c for each row of the array 22 and one bit line 36a–c for each column of the array 22. A memory cell 26 is located at a cross point of a word line 34a–c and a bit line 36a–c.

In the exemplary embodiment, conductive traces functioning as angled lines 38a–e extend diagonally across the memory cell array 22. The angled lines 38a–e, which are angled conductors, extend in a plane on the same side of the array 22 as the word lines 34a–c. There is one angled line 38a–e for each diagonal of the array 22. A memory cell 26 is located at each cross point of an angled line 38a–e with a word line 34a–c and a bit line 36a–c. In other embodiments, the angled lines 38a–e could be angled across only one memory cell 26 or a set number of memory cells 26, such as two or three. Also, in other embodiments, the angled lines 38a–e are positioned on the same side as the bit lines 36a–c or on a side opposing the word lines 34a–c and the bit lines 36a–c.

The write circuit 24 is electrically coupled to the word lines 34a–c, the bit lines 36a–c and the angled lines 38a–e for writing the magnetic memory cells 26. The write circuit 24 includes the row decoder 28a–b electrically coupled to the word lines 34a–c, and the column decoder 30a–b electrically coupled to the bit lines 36a–c. Similarly, the angled decoder 32a–b is electrically coupled to the angled lines 38a–e.

During a write operation, the row decoder 28a–b selects one word line 34a–c and the column decoder 30a–b selects one bit line 36a–c for writing the state of the memory cell 26 located at the selected word line 34a–c and bit line 36a–c cross point. During the write operation; the angled decoder 32a–b selects the one angled line 38a–e crossing the selected memory cell 26.

The write circuit 24 supplies write currents to switch the state of the selected magnetic memory cell 26. The row decoder 28a–b supplies a write current through the selected word line 34a–c to create a magnetic field along the hard axis in the selected memory cell 26. The row decoder 28a–b sources and sinks the write current from the row decoder 28a to the row decoder 28b or vice-versa. The column decoder 30a–b supplies a second write current through the selected bit line 36a–c to create a magnetic field along the easy axis in the selected memory cell 26. The column decoder 30a–b sources and sinks the second write current from the column decoder 30a to the column decoder 30b or vice-versa. Similarly, the angled decoder 32a–b supplies a third write current through the selected angled line 38a–e to create a third magnetic field in the selected memory cell 26. The angled decoder 32a–b sources and sinks the third write current from the angled decoder 32a to the angled decoder 32b or vice-versa. In other embodiments, the row decoder 28a–b, column decoder 30a–b and angled decoder 32a–b may supply current in only one direction. The currents create magnetic fields around the selected word line 34a–c, bit line 36a–c and angled line 38a–e, according to the right hand rule. The three magnetic fields set the orientation of magnetization in the selected memory cell 26, as described in more detail later in this application.

The magnetic memory 20 also includes sense conductors (not shown for clarity), which extend along the y-direction in a plane on one side of the array 22. The sense conductors are electrically coupled to the read circuit for sensing the resistance through the magnetic memory cells 26. The word lines 34a–c, which extend along the x-direction on an adjacent side of the array 22, are also electrically coupled to the read circuit. A magnetic memory cell 26 is located at a cross point of a sense conductor and a word line 34a–c.

During a read operation, the read circuit selects one sense conductor and one word line 34a–c to sense the resistance through the memory cell 26 located at the cross point of the selected sense conductor and the selected word line 34a–c. Any number of methods can be used to sense the resistance through the selected memory cell 26. In one embodiment, the read circuit supplies a constant sense current through the sense conductor to the selected memory cell 26. The constant sense current flows through the selected memory cell 26 and to the selected word line 34a–c. The voltage across the selected memory cell 26 is detected and used to determine the state of the selected memory cell 26. Circuits and methods for sensing the resistance and state of the memory cells 26 may be as disclosed and described in U.S. Pat. No. 6,259,644, issued Jul. 10, 2001, entitled Equipotential Sense Methods For Resistive Cross Point Memory Cell Arrays, which is incorporated herein by reference.

Figure 2:
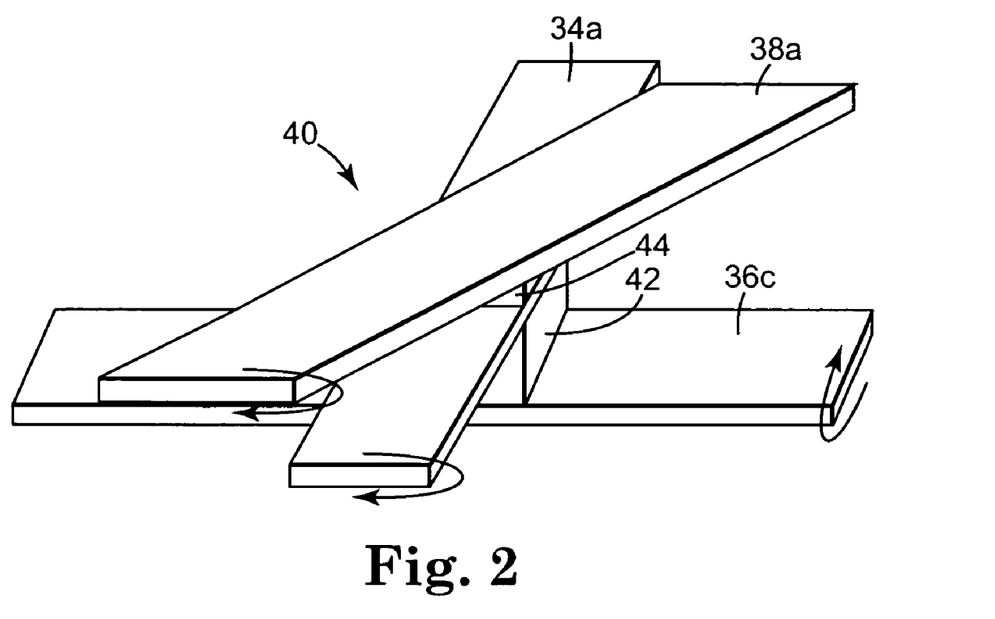
FIG. 2 is a diagram illustrating an exemplary embodiment of a magnetic memory cell array section, according to the present invention.

FIG. 2 is a diagram illustrating an exemplary embodiment of an array section, indicated at 40. The array section 40 includes a magnetic memory cell 26 having the word line 34a, the bit line 36c, the angled line 38a, a memory cell stack 42 and an isolation layer 44. The memory cell stack 42 is positioned between the word line 34a and the bit line 36c. The word line 34a and the bit line 36c are illustrated as essentially orthogonal to one another. However, the word line 34a and the bit line 36c can lie in other angular relations to one another.

The angled line 38a is located next to the isolation layer 44, which insulates the angled line 38a from the word line 34a. The isolation layer 44 is formed thin enough to maintain the angled line 38a in close relation to the memory cell stack 42 such that the magnetic field created around the angled line 38a assists in switching the orientation of magnetization in the stack 42. The thickness of the isolation layer 44 can be anywhere from approximately 50 Angstroms to approximately 1500 Angstroms and is preferably 300 Angstroms to 800 Angstroms thick. The angled line 38a is illustrated as essentially angled 45 degrees relative to the word line 34a and the bit line 36c. However, it is understood that the angled line 38a can have any angle of orientation between 0 degrees and 90 degrees relative to the word line 34a and the bit line 36c.

During a write operation, write currents are passed through the word line 34a, the bit line 36c and the angled line 38a to change the orientation of magnetization in the stack 42. The word line 34a and bit line 36c write currents create magnetic fields, according to the right hand rule, which are essentially orthogonal to one another. The angled line 38a write current creates a magnetic field, according to the right hand rule, between the word line 34a and bit line 36c magnetic fields. The magnetic field around the angled line 38a has components, which align with the magnetic fields around the word line 34a and the bit line 36c. These components add to the word line 34a and the bit line 36c magnetic fields to switch the orientation of magnetization in the stack 42.

Figure 3:
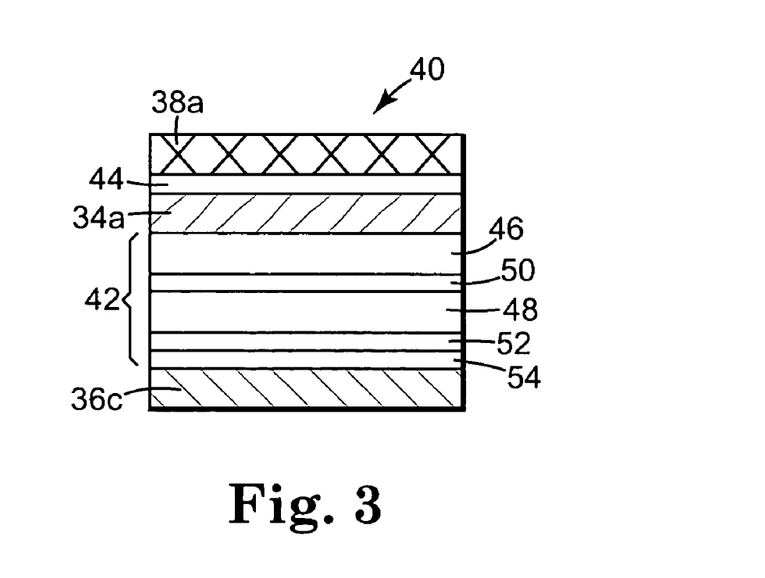
FIG. 3 is a diagram illustrating a cross section of the exemplary embodiment of the magnetic memory cell array section, according to the present invention.

FIG. 3 is a diagram illustrating a cross section of the exemplary embodiment of the array section 40. The array section 40 includes the memory cell stack 42 positioned between the word line 34a and the bit line 36c. The angled line 38a is located next to the isolation layer 44, which insulates the angled line 38a from the word line 34a. In the exemplary embodiment, the memory cell stack 42 includes a sense layer 46, a barrier layer 50, a reference layer 48, a sense conductor 52 and a second isolation layer, indicated at 54. The barrier layer 50 electrically couples the sense layer 46 to the reference layer 48. The sense conductor 52 is located between the reference layer 48 and the second isolation layer 54, which is next to the bit line 36c. The second isolation layer 54 insulates the bit line 36c from the stack 42 and, ultimately, the word line 34a.

In other embodiments, the sense conductor 52 and the second isolation layer 54 can be removed from the stack 42. In these embodiments, the bit line 36c is electrically coupled directly to the reference layer 48 and used during a read operation with the word line 34a. The bit line 36c and word line 34a, with the angled line 38a, can also be used during a write operation. In other embodiments, a second sense conductor and a third isolation layer are added between the sense layer 46 and the word line 34a. The second sense conductor is electrically coupled to the sense layer 46 and the third isolation layer insulates the second sense conductor from the word line 34a. In these embodiments, the two sense conductors, 52 and the second sense conductor, are used during a read operation. The word line 34a, the bit line 36c and the angled line 38a are used during a write operation. In other embodiments, the sense conductor 52 can be removed from stack 42 and other means, such as a conductor in electrical communication with reference layer 48, made available for sensing the state of the memory cell 26. Also, in all of these embodiments, the positions of the sense layer 46 and the reference layer 48 can be switched with one another. Other embodiments of the present invention will become apparent to those skilled in the art after reading this specification.

In the present embodiment, during a read operation, the word line 34a and the sense conductor 52 are selected by the read circuit. The read circuit provides a sense current through the word line 34a and the stack 42 and back to the read circuit via the sense conductor 52. The voltage across the stack 42, from the word line 34a to the sense conductor 52, is detected and used to determine the state of the memory cell 26.

During a write operation, the write circuit 24 passes write currents through the word line 34a, the bit line 36c, and the angled line 38a to create magnetic fields in the sense layer 46. The isolation layer 44 is thick enough to insulate the angled line 38a from the word line 34a and is thin enough so that the magnetic field around the angled line 38a assists in switching the orientation of magnetization in the sense layer 46.

Figure 4:
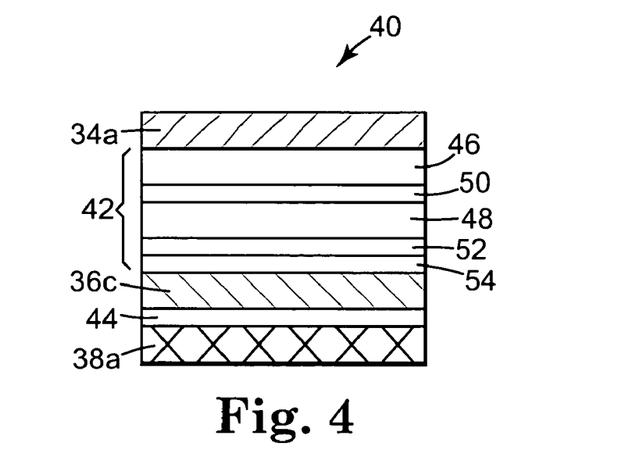
FIG. 4 is a diagram illustrating a cross section of another exemplary embodiment of the magnetic memory cell array section, according to the present invention.

FIG. 4 is a diagram illustrating a cross section of another embodiment of the array section 40. The stack 42 is positioned between the word line 34a and the bit line 36c. In this embodiment, the angled line 38a is positioned near the bit line 36c. The isolation layer 44 is positioned between the bit line 36c and the angled line 38a to insulate them from one another. Read and write operations are performed as previously described.

During a read operation, the word line 34a and the sense conductor 52 are selected by the read circuit. Any number of circuits and methods can be used to sense the resistance through memory cell 26. In some embodiments, the read circuit provides a sense voltage across the selected memory cell 26. The word line 34a is held at one potential, and the sense conductors 52 are held at a second potential. The current through the stack 42, from the word line 34a to the sense conductor 52, is detected and used to determine the state of the memory cell 26. In another embodiment, the read circuit and method previously described are used, where the read circuit provides a sense current through the word line 34a and the stack 42 back to the read circuit via the sense conductor 52. The voltage across the stack 42, from the word line 34a to the sense conductor 52, is detected and used to determine the state of the memory cell 26. Circuits and methods for sensing the resistance and state of the memory cell 26 are disclosed and described in U.S. Pat. No. 6,259,644.

During a write operation, the write circuit 24 passes write currents through the word line 34a, the bit line 36c, and the angled line 38a to create magnetic fields in the sense layer 46. The isolation layer 44 is thick enough to insulate the angled line 38a from the bit line 36c and is thin enough to permit the magnetic field around the angled line 38a to assist in switching the orientation of magnetization in the sense layer 46.

Figure 5:
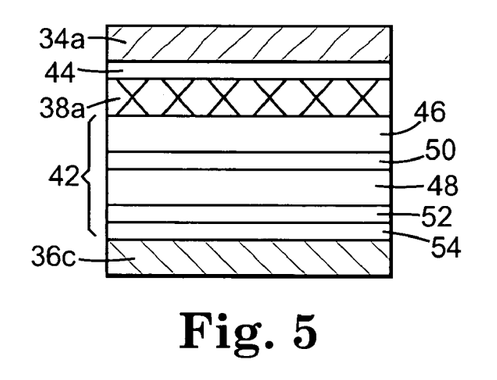
FIG. 5 is a diagram illustrating a cross section of another exemplary embodiment of the magnetic memory cell array section, according to the present invention.
Figure 6:
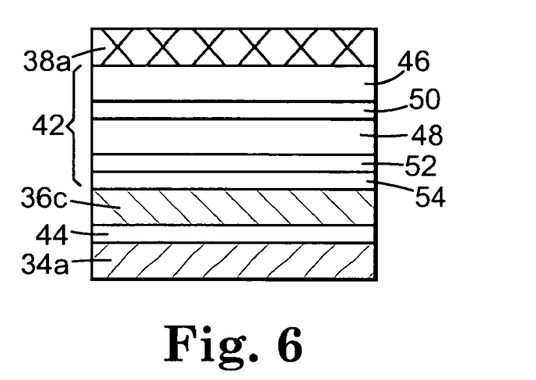
FIG. 6 is a diagram illustrating a cross section of another exemplary embodiment of the magnetic memory cell array section, according to the present invention.

FIGS. 5–8 are diagrams illustrating cross sections of different exemplary embodiments of the array section 40. In each embodiment, the angled line 38a is located next to the memory cell stack 42. FIGS. 5 and 6 illustrate the memory cell stack 42 positioned between the angled line 38a and the bit line 36c. The angled line 38a is next to the sense layer 46 and the bit line 36c is next to the second isolation layer 54. FIG. 5 illustrates the isolation layer 44 positioned between the angled line 38a and the word line 34a. FIG. 6 illustrates the isolation layer 44 positioned between the bit line 36c and the word line 34a.

During a read operation, the read circuit selects the angled line 38a and the sense conductor 52. Any number of read circuits and methods can be used to sense the resistance. In one embodiment, the read circuit passes a sense current through the angled line 38a and the stack 42, and back to the read circuit via the sense conductor 52. The voltage across the stack 42, from the angled line 38a to the sense conductor 52 is detected and used to determine the state of the memory cell 26.

During a write operation, the write circuit 24 passes write currents through the word line 34a, the bit line 36c, and the angled line 38a to create magnetic fields in the sense layer 46. The isolation layer 44 is thick enough to insulate the word line 34a from the rest of the memory cell 26 and is thin enough to permit the magnetic field around the word line 34a to assist in switching the orientation of magnetization in the sense layer 46.

Figure 7:
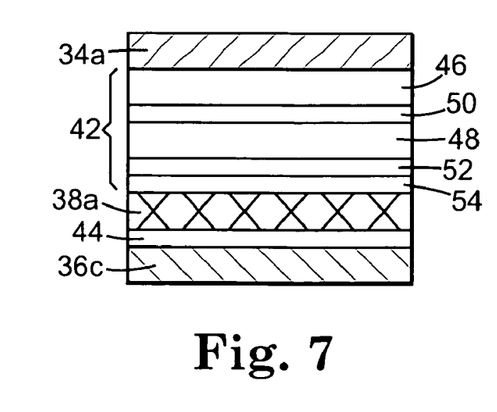
FIG. 7 is a diagram illustrating a cross section of another exemplary embodiment of the magnetic memory cell array section, according to the present invention.
Figure 8:
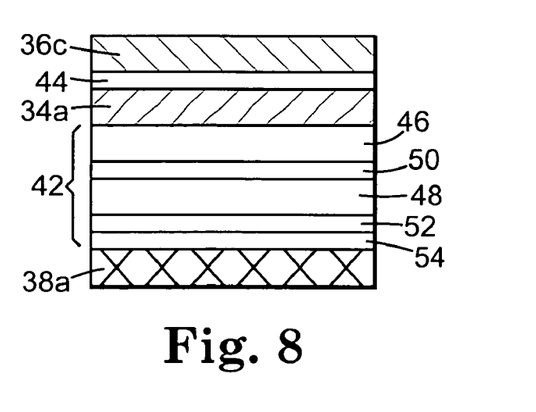
FIG. 8 is a diagram illustrating a cross section of another exemplary embodiment of the magnetic memory cell array section, according to the present invention.

FIGS. 7 and 8 illustrate the stack 42 located between the word line 34a and the angled line 38a. The word line 34a is next to the sense layer 46 and the angled line 38a is next to the second isolation layer 54. FIG. 7 illustrates the isolation layer 44 located between the angled line 38a and the bit line 36c, and FIG. 8 illustrates the isolation layer 44 between the word line 34a and the bit line 36c. In other embodiments, the word line 34a, the bit line 36c, and the angled line 38a can be switched with one another and positioned in any combination adjacent the stack 42.

For the embodiments illustrated in FIGS. 7 and 8, during a read operation, the read circuit selects the word line 34a and the sense conductor 52. Any number of read circuits and methods can be used to sense the resistance. In one embodiment, the read circuit passes a sense current through the word line 34a and the stack 42, and back to the read circuit via the sense conductor 52. The voltage across the stack 42 from the word line 34a to the sense conductor 52 is detected and used to determine the state of the memory cell 26.

During a write operation, the write circuit 24 passes write currents through the word line 34a, the bit line 36c, and the angled line 38a to create magnetic fields in the sense layer 46. The isolation layer 44 is thick enough to insulate the bit line 36c and is thin enough to permit the magnetic field around the bit line 36c to assist in switching the orientation of magnetization in the sense layer 46.

Figure 9:
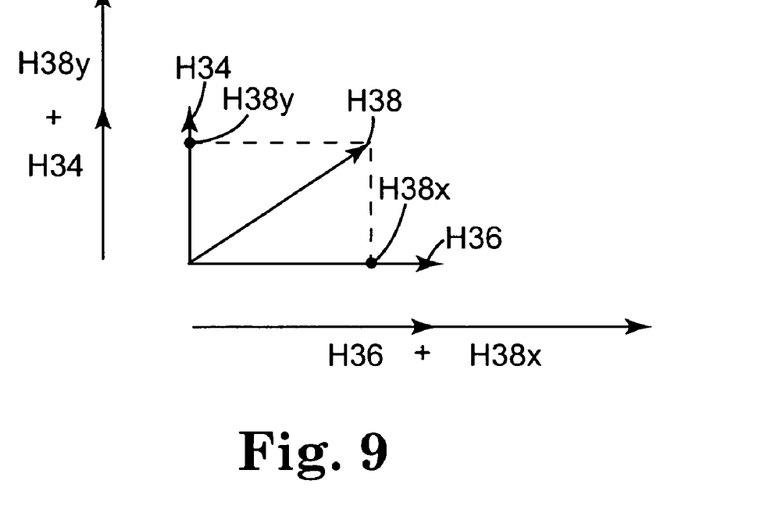
FIG. 9 is a vector diagram illustrating the magnetic fields present in a sense layer during a write operation in the exemplary embodiment of the magnetic memory, according to the present invention.

FIG. 9 is a vector diagram illustrating the magnetic fields in the sense layer 46 during a write operation in the exemplary embodiment of the magnetic memory 20 illustrated in FIG. 1, according to the present invention. During a write operation, the write circuit 24 supplies write currents to the word line 34a, the bit line 36c, and the angled line 38a to produce magnetic fields, according to the right hand rule. As illustrated in FIG. 9, current passing through the word line 34a creates magnetic field H34 in the y-direction. Current passing through the bit line 36c creates an orthogonal magnetic field H36 in the x-direction. The magnetic field H34 is along the hard axis of the sense layer 46 and the magnetic field H36 is along the easy axis of the sense layer 46. Current passing through the angled line 38a creates a third magnetic field H38, which is angled between the word line magnetic field H34 and the bit line magnetic field H36.

The third magnetic field H38 has an x-direction component, indicated at H38x, and a y-direction component, indicated at H38y. The x and y components of the angled line magnetic field H38 add to the bit line magnetic field H36 and the word line magnetic field H34 to increase the magnetic field strength in the sense layer 46. Thus, the total magnetic field strength in the x-direction is H36+H38x and the total magnetic field in the y-direction is H34+H38y. The stronger magnetic fields in the x and y direction ensure switching of the selected memory cell 26 at the intersection of the selected word line 34a, bit line 36c and angled line 38a.

Non-selected memory cells 26 along the selected word line 34a, bit line 36c and angled line 38a, referred to as half-selected memory cells 26, are presented with one of the three magnetic fields H34, H36, or H38. The currents passing through the selected line crossing the half-selected memory cells 26 create the magnetic field. One magnetic field is not large enough to switch the half-selected memory cell 26. Write margin and half-select margin are increased by using a third angled line 38a to produce an angled magnetic field H38, as described further next.

Figure 10:
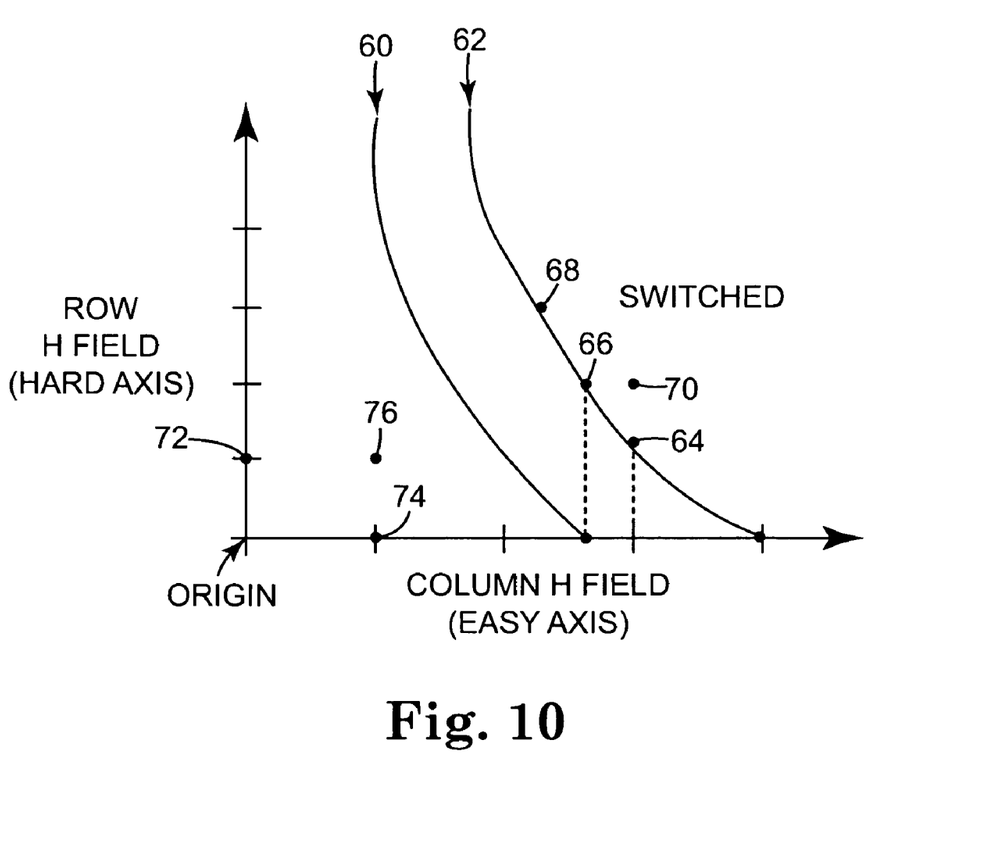
FIG. 10 is a graph illustrating magnetic field strength in the sense layer along the easy axis and hard axis in one exemplary embodiment of the magnetic memory, according to the present invention.

FIG. 10 is a graph illustrating magnetic field strength in the sense layer 46 along the easy axis and the hard axis for switching the orientation of magnetization in the sense layer 46. The graph is referred to as part of an asteroid diagram. In an asteroid diagram, the magnetic field along the hard axis is represented by the vertical axis or y axis and the magnetic field along the easy axis is represented along the horizontal axis or x axis. In the exemplary embodiment, the hard axis field is created by currents passing through the row or word line 34a and the easy axis field is created by currents passing through the column or bit line 36c.

The curves in the asteroid diagram separate the diagram into three different areas. The area to the upper right of the diagram represents magnetic field strengths that switch the orientation of magnetization in sense layer 46. The area to the lower left of the diagram, between the origin and the first line represents the magnetic field strengths that do not switch the orientation of magnetization in the sense layer 46. The area between the two lines is a gray area where switching occurs for some memory cells 26, but not for others. The first curved line 60 away from the origin represents the minimum magnetic field strength needed to begin switching the state of magnetic memory cells 26 in the array 22. The second curved line 62 represents the maximum magnetic field strength needed to switch the state of any magnetic memory cell 26 in the array 22. The following examples demonstrate how write margin and half-select margin are increased by using a third angled line 38a to produce an angled magnetic field H38.

In the first example, currents are supplied to the word line 34a and the bit line 36c to provide one unit of Row H Field and three units of Column H Field, the magnetic field strength in the selected memory cell 26 is indicated at 64. The magnetic field strength may be enough to switch the selected magnetic memory cell 26. However, the half-selected memory cells 26 along the bit line 36c are presented with three units of Column H Field. As illustrated in FIG. 10, this is beyond first curved line 60 along the x-axis and enough to switch some of the half-selected magnetic memory cells 26. Therefore, this is not a good selection for Row H Field and Column H Field strength.

In another example, two units of Row H Field and 2.5 units of Column H Field are applied to the selected memory cell 26, as indicated at 66. Again, the magnetic field strength may be enough to switch the orientation of magnetization in the sense layer 46 of the selected memory cell 26. However, as indicated along the Column H Field axis, this is right on or surpasses the first curved line 60 and may also switch some half-selected memory cells 26. In these examples, the Column H Field along the easy axis of the magnetic memory cell 26 is strong enough to switch some of the magnetic memory cells 26 in the array 22.

In another example, three units of Row H Field and 2 units of Column H Field are applied to switch the selected memory cell 26, as indicated at 68. This is good. However, the magnetic field strength is barely across the second curved line 62 and therefore the write margin for switching the magnetic memory cell 26 is very small.

In an example including magnetic field H38, the write margin and the half-select margin are increased. During a write operation, a write current is supplied to the word line 34a to generate one unit of magnetic field H34 along the Row H Field axis. A write current is also supplied to the bit line 36c to generate two units of magnetic field H36 along the Column H Field axis. In addition, a write current is supplied to the angled line 38a to generate one unit of magnetic field H38y along the Row H Field axis and one unit of H38x along the Column H Field axis. The fields combine to give two units of Row H Field and three units of Column H Field, as indicated at 70. The magnetic field strength in the sense layer 46 is squarely within the switched region of the asteroid diagram and the write margin is increased. Thus, the selected magnetic memory cell 26 definitely switches. The half-selected memory cells 26 are presented with one Row H Field, as indicated at 72, or one Column H Field, as indicated at 74, or one angled line magnetic field H38, as indicated at 76. Each of these points is squarely in the non-switched region of the asteroid diagram, which indicates an increased half-select margin. The write margin for switching selected magnetic memory cells 26 and the half-select margin for not switching half-selected magnetic memory cells 26 are increased.

What is claimed is:

1. A magnetic memory, comprising:
a magnetic memory stack;
a first line adjacent the magnetic memory stack;
a second line crossing the first line; and
a third line crossing the first line and the second line, angled relative to the first line and the second line, where the first line, the second line and the third line are configured to produce magnetic fields that set states of the magnetic memory stack.

2. The magnetic memory of claim 1, where the first line is orthogonal to the second line.

3. The magnetic memory of claim 1, where the magnetic memory stack has an easy axis and the first line is aligned to produce one of the magnetic fields along the easy axis.

4. The magnetic memory of claim 3, where the first line is orthogonal to the second line.

5. The magnetic memory of claim 1, where the first line is adjacent a side of the magnetic memory stack and the second line is adjacent an opposing side of the magnetic memory stack.

6. The magnetic memory of claim 1, where the first line is adjacent a side of the magnetic memory stack and the third line is adjacent an opposing side of the magnetic memory stack.

7. The magnetic memory of claim 1, where the magnetic memory stack includes a sense conductor.

8. A magnetic memory, comprising:
a magnetic memory stack;
a first line adjacent the magnetic memory stack;
a second line crossing the first line at the magnetic memory stack; and
a third line crossing the first line and the second line at the magnetic memory stack, where electrical currents applied to the first line, the second line and the third line create a first magnetic field, a second magnetic field and a third magnetic field, and the third magnetic field adds to the first magnetic field and the second magnetic field to set states of the magnetic memory stack.

9. The magnetic memory of claim 8, where the first line is orthogonal to the second line.

10. The magnetic memory of claim 8, where the magnetic memory stack includes a sense layer having an easy axis and the first line is aligned to produce the first magnetic field along the easy axis.

11. The magnetic memory of claim 8, where the magnetic memory stack includes a sense layer having an easy axis and a hard axis and the first line is aligned to produce the first magnetic field along the easy axis and the second line is aligned to produce the second magnetic field along the hard axis.

12. A magnetic memory, comprising:
an array of magnetic memory cells;
first lines crossing the array of magnetic memory cells;
second lines crossing the first lines at magnetic memory cells in the array of magnetic memory cells; and
third lines crossing the first lines and the second lines at the magnetic memory cells in the array of magnetic memory cells and angled relative to the first lines and the second lines, where the first lines and the second lines and the third lines are configured to produce magnetic fields that cooperate to switch states of the magnetic memory cells in the array of magnetic memory cells.

13. The magnetic memory of claim 12, where the third lines cross each of the magnetic memory cells in a diagonal across the array of magnetic memory cells.

14. The magnetic memory of claim 12, where the third lines cross only one of the magnetic memory cells.

15. The magnetic memory of claim 12, where electrical current passed through one of the first lines, one of the second lines and one of the third lines produces a first magnetic field, a second magnetic field and a third magnetic field in an intersecting magnetic memory cell, and produces only the first magnetic field, only the second magnetic field or only the third magnetic field in non-intersecting magnetic memory cells.

16. A magnetic memory, comprising:
an array of magnetic memory cells;
first lines crossing the array of magnetic memory cells;
second lines crossing the first lines; and
third lines crossing the first lines and the second lines, where write currents passed through one of the first lines, one of the second lines and one of the third lines create a first magnetic field, a second magnetic field and a third magnetic field, and the third magnetic field includes components aligned with the first magnetic field and the second magnetic field to set states of an intersecting magnetic memory cell in the array of magnetic memory cells.

17. The magnetic memory of claim 16, where the third lines cross magnetic memory cells in a diagonal across the array of magnetic memory cells.

18. The magnetic memory of claim 16, where the third lines cross only one magnetic memory cell in the array of magnetic memory cells.

19. The magnetic memory of claim 16, where only the first magnetic field, only the second magnetic field and only the third magnetic field are created in non-intersecting magnetic memory cells.

20. A magnetic memory, comprising:
a magnetic memory stack including a sense layer;
a first line crossing the magnetic memory stack;
a second line crossing the first line at the magnetic memory stack; and
a third line crossing the first line and the second line at the magnetic memory stack, angled relative to the first line and the second line, where the first line, the second line and the third line are located close enough to the sense layer to produce magnetic fields that set states in the sense layer.

21. A magnetic memory, comprising:
a magnetic memory stack;
means for generating a first magnetic field in the magnetic memory stack;
means for generating a second magnetic field in the magnetic memory stack; and
means for generating a third magnetic field in the magnetic memory stack, where the first magnetic field, the second magnetic field and the third magnetic field combine to set states of the magnetic memory stack.

22. The magnetic memory of claim 21, where the combination of the first magnetic field, the second magnetic field and the third magnetic field provides a larger write margin in the magnetic memory stack, as compared to the combination of any two of the first magnetic field, the second magnetic field and the third magnetic field.

23. The magnetic memory of claim 21, where the first magnetic field is along the easy axis of the magnetic memory stack and the second magnetic field is along the hard axis of the magnetic memory stack.

24. The magnetic memory of claim 21, where the first magnetic field is aligned between the easy axis and the hard axis of the magnetic memory stack.

\* \* \* \* \*